(12) United States Patent
Singer et al.

(10) Patent No.: US 9,876,155 B2
(45) Date of Patent: Jan. 23, 2018

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Frank Singer, Regenstauf (DE); Jürgen Moosburger, Lappersdorf (DE); Matthias Sabathil, Regensburg (DE); Matthias Sperl, Mintraching (DE); Björn Hoxhold, Sinzing Viehhausen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/524,114

(22) PCT Filed: Nov. 3, 2015

(86) PCT No.: PCT/EP2015/075518
§ 371 (c)(1),
(2) Date: May 3, 2017

(87) PCT Pub. No.: WO2016/071308
PCT Pub. Date: May 12, 2016

(65) Prior Publication Data
US 2017/0331018 A1 Nov. 16, 2017

(30) Foreign Application Priority Data

Nov. 4, 2014 (DE) .................. 10 2014 116 080

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/005* (2013.01); *H01L 33/502* (2013.01); *H01L 33/54* (2013.01);
(Continued)

(58) Field of Classification Search
USPC ......... 257/81, 82, 91, 98, 99, 100, 116, 117, 257/432–437, 749, E33.056–E33.059,
(Continued)

(56) References Cited

U.S. PATENT DOCUMENTS

| 2011/0316017 A1 | 12/2011 | Liu et al. | |
| 2016/0005722 A1* | 1/2016 | Illek | ............... H01L 25/167 257/99 |
| 2016/0155891 A1* | 6/2016 | Moosburger | ............ H01L 24/24 257/98 |

FOREIGN PATENT DOCUMENTS

| DE | 10 2008 011 809 A1 | 6/2009 |
| DE | 10 2008 049 399 A1 | 4/2010 |

(Continued)

*Primary Examiner* — Tram H Nguyen
(74) *Attorney, Agent, or Firm* — DLA Piper LLP (US)

(57) ABSTRACT

An optoelectronic component includes a composite body including a molded body; and an optoelectronic semiconductor chip embedded into the molded body, wherein the optoelectronic semiconductor chip includes a first electrical contact on its top side, a first top side metallization is arranged on the top side of the composite body and electrically conductively connects the first electrical contact to the through contact, a second top side metallization is arranged on the top side of the composite body and electrically insulated with respect to the first top side metallization, the second top side metallization completely delimits a part of the top side of the optoelectronic semiconductor chip, and a wavelength-converting material is arranged in a region completely delimited by the second top side metallization on the top side of the composite body, the wavelength-convert- (Continued)

ing material extending as far as the second top side metallization.

19 Claims, 7 Drawing Sheets

(51) Int. Cl.
*H01L 33/50* (2010.01)
*H01L 33/54* (2010.01)
*H01L 33/60* (2010.01)

(52) U.S. Cl.
CPC ...... *H01L 33/60* (2013.01); *H01L 2933/0033* (2013.01); *H01L 2933/0041* (2013.01); *H01L 2933/0058* (2013.01); *H01L 2933/0066* (2013.01)

(58) Field of Classification Search
USPC .......... 257/E25.032; 438/E31.058, E31.063, 438/E31.115, E25.032, E27.133–E27.139
See application file for complete search history.

(56) References Cited

FOREIGN PATENT DOCUMENTS

| DE | 10 2010 024 864 A1 | 12/2011 |
|----|--------------------|---------|
| DE | 10 2010 027 253 A1 | 1/2012  |
| DE | 10 2011 056 220 A1 | 6/2013  |
| DE | 10 2013 212 247 A1 | 12/2014 |

* cited by examiner (I-I)

(II-II)

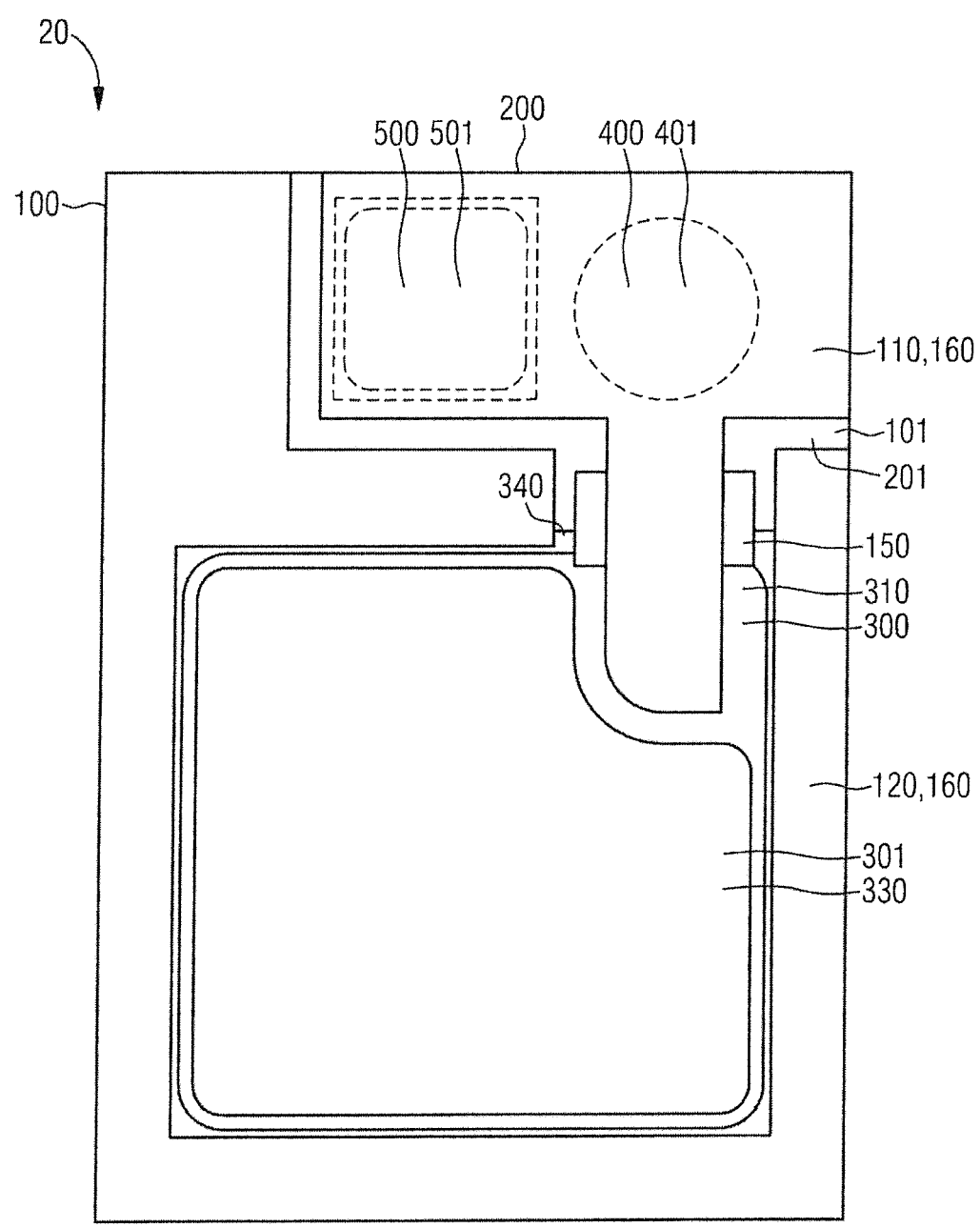

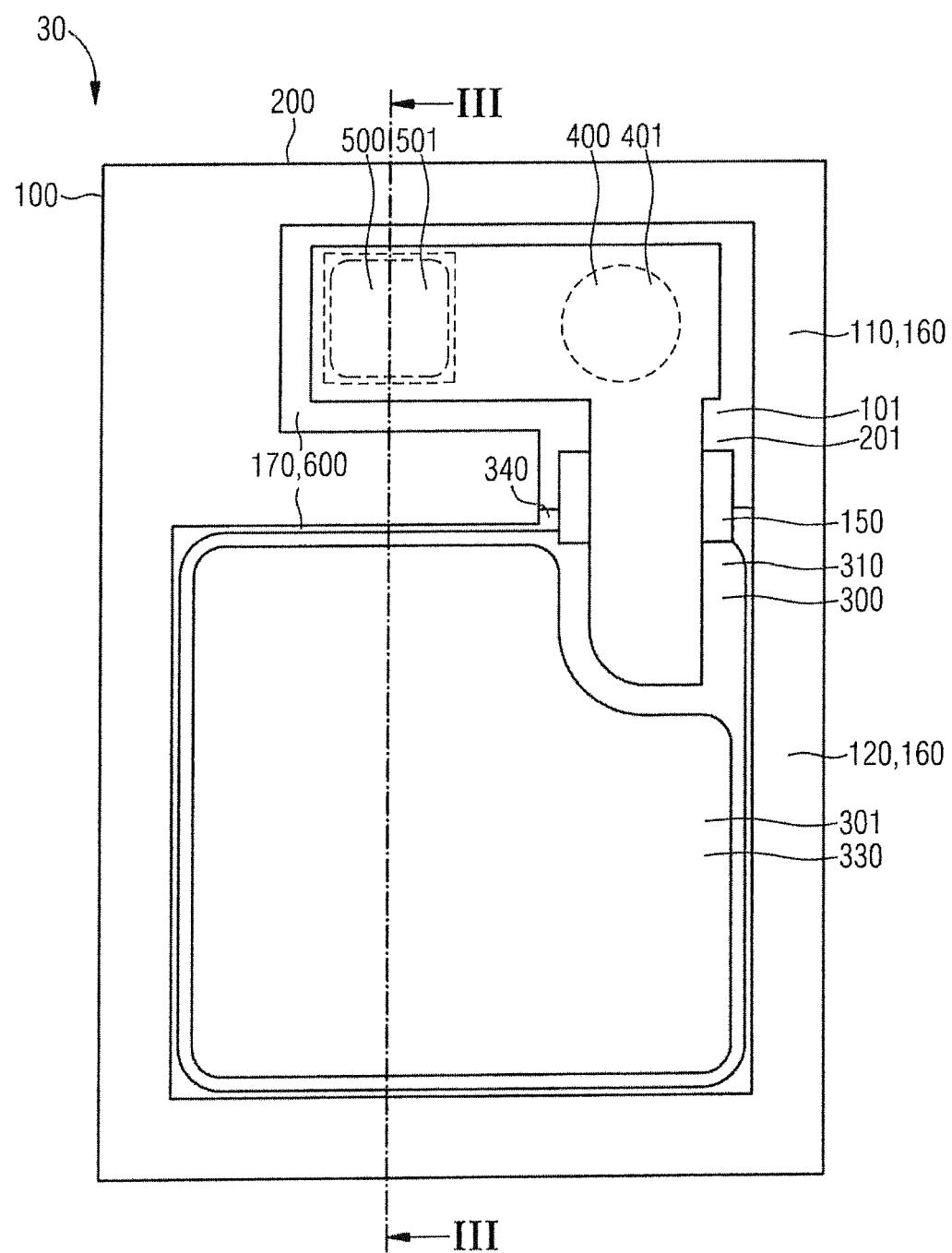

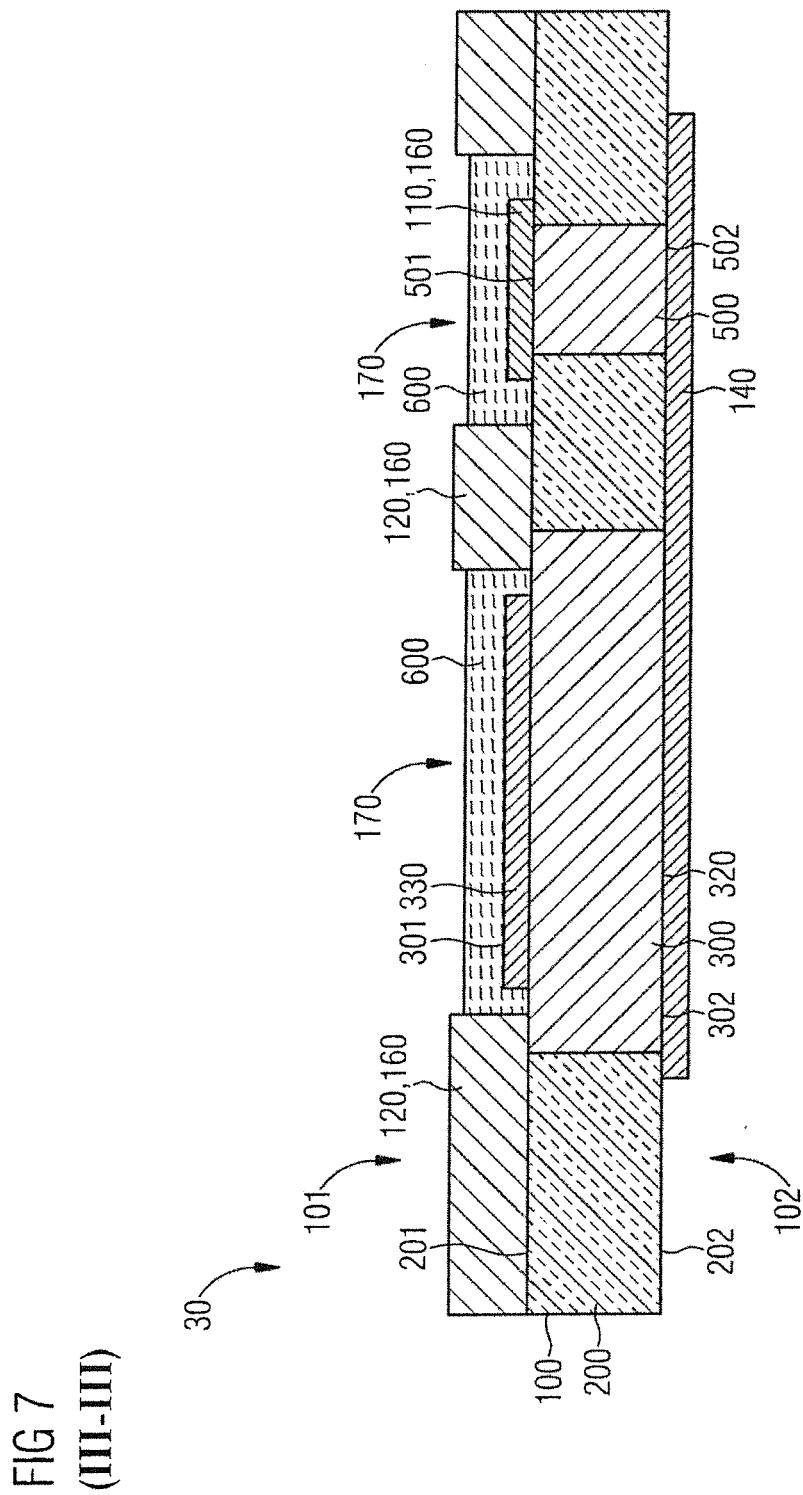

OPTOELECTRONIC COMPONENT AND METHOD FOR THE PRODUCTION THEREOF

TECHNICAL FIELD

This disclosure relates to an optoelectronic component and a method of producing an optoelectronic component.

BACKGROUND

Optoelectronic components, for example, light emitting diode components are known with different housing variants. By way of example, optoelectronic components are known in which an optoelectronic semiconductor chip is embedded into a molded body that forms the supporting housing part. Such optoelectronic components comprise extremely compact external dimensions.

SUMMARY

We provide an optoelectronic component including a composite body including a molded body; and an optoelectronic semiconductor chip embedded into the molded body, wherein an electrically conductive through contact extends from a top side of the composite body to an underside of the composite body through the molded body, a top side of the optoelectronic semiconductor chip is at least partly not covered by the molded body, the optoelectronic semiconductor chip includes a first electrical contact on its top side, a first top side metallization is arranged on the top side of the composite body and electrically conductively connects the first electrical contact to the through contact, a second top side metallization is arranged on the top side of the composite body and electrically insulated with respect to the first top side metallization, the second top side metallization completely delimits a part of the top side of the optoelectronic semiconductor chip, and a wavelength-converting material is arranged in a region completely delimited by the second top side metallization on the top side of the composite body, the wavelength-converting material extending as far as the second top side metallization.

We also provide a method of producing an optoelectronic component including providing an optoelectronic semiconductor chip including a first electrical contact on a top side; embedding the optoelectronic semiconductor chip into a molded body to form a composite body, the top side of the optoelectronic semiconductor chip is at least partly not covered by the molded body; establishing an electrically conductive through contact extending from a top side of the composite body to an underside of the composite body through the molded body; establishing a first top side metallization on the top side of the composite body, the first top side metallization electrically conductively connecting the first electrical contact to the through contact; establishing a second top side metallization on the top side of the composite body, the second top side metallization being electrically insulated with respect to the first top side metallization, wherein the second top side metallization completely delimits a part of the top side of the optoelectronic semiconductor chip; and arranging a wavelength-converting material in a region completely delimited by the second top side metallization on the top side of the composite body, wherein the wavelength-converting material extends as far as the second top side metallization.

BRIEF DESCRIPTION OF THE DRAWINGS

FIG. 5 schematically shows a plan view of a second optoelectronic component.

FIG. 6 schematically shows a plan view of a third optoelectronic component.

FIG. 7 schematically shows a sectional side view of the third optoelectronic component.

Figure 1:
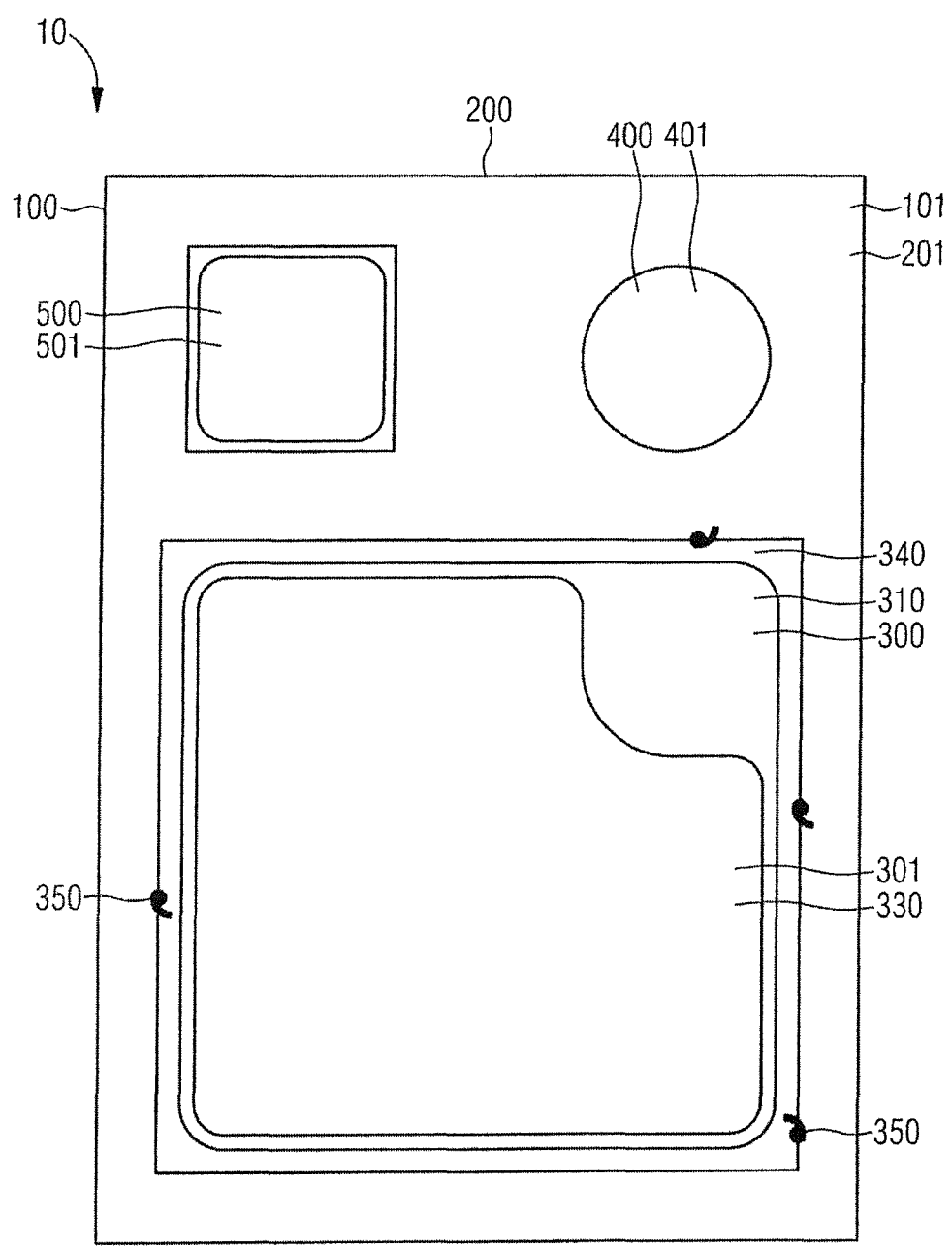
FIG. 1 schematically shows a plan view of a first optoelectronic component in an unfinished processing state.

LIST OF REFERENCE SIGNS 10 first optoelectronic component
20 second optoelectronic component
30 third optoelectronic component
100 composite body
101 top side
102 underside
110 first top side metallization
120 second top side metallization
130 first underside metallization
140 second underside metallization
150 electrically insulating material
160 encapsulation layer
170 delimited region
200 molded body
201 top side
202 underside
300 optoelectronic semiconductor chip
301 top side
302 underside
310 first electrical contact
320 second electrical contact
330 mesa
340 edge region
350 slag burr
400 through contact
401 top side
402 underside
500 protective diode
501 top side
502 underside
600 wavelength-converting material

DETAILED DESCRIPTION

Our optoelectronic component comprises a composite body comprising a molded body and an optoelectronic semiconductor chip embedded into the molded body. An electrically conductive through contact extends from a top side of the composite body to an underside of the composite body through the molded body. A top side of the optoelectronic semiconductor chip is at least partly not covered by the molded body. The optoelectronic semiconductor chip comprises a first electrical contact on its top side. A first top side metallization is arranged on the top side of the composite body and electrically conductively connects the first electrical contact to the through contact. In addition, a second top side metallization is arranged on the top side of the composite body and electrically insulated with respect to the first top side metallization.

The second top side metallization on the top side of the composite body of this optoelectronic component may advantageously act as a metallic mirror that increases reflectivity of the top side of the composite body of the optoelectronic component. Absorption losses as a result of absorption of electromagnetic radiation emitted by the optoelectronic semiconductor chip of the optoelectronic component on the top side of the composite body are reduced as a result. This may advantageously result in an improved efficiency of the optoelectronic component.

The second top side metallization on the top side of the composite body of the optoelectronic component may additionally prevent excessive aging of the material of the molded body. This may advantageously increase the lifetime of the optoelectronic component.

The second top side metallization may extend over a part of the top side of the optoelectronic semiconductor chip. Advantageously, reflectivity of that part of the top side of the optoelectronic semiconductor chip which is covered by the second top side metallization is also increased as a result. By way of example, the second top side metallization may increase reflectivity of an edge of the top side of the optoelectronic semiconductor chip.

The second top side metallization may completely delimit the first top side metallization. Advantageously, the second top side metallization as a result may cover a large part of the top side of the composite body of the optoelectronic component, which may result in a high reflectivity of the top side of the composite body.

The second top side metallization completely delimits a part of the top side of the optoelectronic semiconductor chip. Advantageously, the second top side metallization as a result forms a closed cavity around that part of the top side of the optoelectronic semiconductor chip which is delimited by the second top side metallization, which makes it possible to arrange a potting material above the top side of the optoelectronic semiconductor chip, the potting material being confined by the cavity formed by the second top side metallization. The cavity formed by the second top side metallization is then filled with the potting material such that the potting material extends as far as the second top side metallization.

A wavelength-converting material is arranged in a region completely delimited by the second top side metallization on the top side of the composite body. In this case, the wavelength-converting material may be confined by the second top side metallization. The cavity formed by the second top side metallization is thus filled with the wavelength-converting material such that the wavelength-converting material extends as far as the second top side metallization. The wavelength-converting material may convert electromagnetic radiation emitted by the optoelectronic semiconductor chip of the optoelectronic component at least partly into electromagnetic radiation of a different wavelength. As a result, light comprising a white color impression may be generated, for example, from electromagnetic radiation comprising a wavelength from the blue or ultraviolet spectral range.

Above an edge region of the top side of the optoelectronic semiconductor chip, an electrically insulating material may be arranged between the top side of the optoelectronic semiconductor chip and the first top side metallization. Advantageously, the electrically insulating material makes it possible to ensure that the first top side metallization on the top side of the composite body is electrically insulated with respect to a second electrical contact of the optoelectronic semiconductor chip and thus does not produce a short circuit between the first electrical contact and the second electrical contact of the optoelectronic semiconductor chip. This is ensured by the electrically insulating material even when, in the edge region of the top side of the optoelectronic semiconductor chip, there is an electrically conductive connection to the second electrical contact of the optoelectronic semiconductor chip, for example, as a result of a slag burr arranged in the edge region of the top side of the optoelectronic semiconductor chip.

A first underside metallization may be arranged on the underside of the composite body and electrically conductively connected to the through contact. As a result, the first underside metallization electrically conductively connects to the first electrical contact of the optoelectronic semiconductor chip of the optoelectronic component via the through contact and the first top side metallization. The first underside metallization may serve, for example, for the electrical contacting of the optoelectronic component.

An underside of the optoelectronic semiconductor chip may be at least partly exposed on the underside of the composite body. In this case, the optoelectronic semiconductor chip comprises a second electrical contact on its underside. Advantageously, as a result, the second electrical contact on the underside of the optoelectronic semiconductor chip of the optoelectronic component is also exposed on the underside of the composite body, which enables an electrical contacting of the second electrical contact of the optoelectronic semiconductor chip.

The second top side metallization may electrically conductively connect to the second electrical contact of the optoelectronic semiconductor chip. The electrically conductive connection between the second top side metallization on the top side of the composite body of the optoelectronic component and the second electrical contact of the optoelectronic semiconductor chip may be formed, for example, by a slag burr arranged in an edge region of the top side of the optoelectronic semiconductor chip. However, since the second top side metallization of the optoelectronic component is advantageously electrically insulated with respect to the first top side metallization of the optoelectronic component, even in this case, there is no short circuit between the first electrical contact and the second electrical contact of the optoelectronic semiconductor chip of the optoelectronic component.

A second underside metallization may be arranged on the underside of the composite body and electrically conductively connected to the second electrical contact. The second underside metallization may serve for the electrical contacting of the optoelectronic component. The optoelectronic component may be provided, for example, as an SMT component for surface mounting, for example, for surface mounting by reflow soldering.

A protective diode may be embedded into the molded body. In this case, the first top side metallization electrically conductively connects to the protective diode. The protective diode embedded into the molded body may protect the optoelectronic semiconductor chip of the optoelectronic component against damage as a result of electrostatic discharges. As a result of the integration of the protective diode into the molded body of the optoelectronic component, it is advantageously not necessary to connect the optoelectronic component to a further, external protective diode.

The second underside metallization may electrically conductively connect to the protective diode. Advantageously, as a result, the protective diode electrically connects in parallel or in antiparallel with the optoelectronic semiconductor chip of the optoelectronic component.

A method of producing an optoelectronic component comprises steps of providing an optoelectronic semiconductor chip comprising a first electrical contact on a top side, and embedding the optoelectronic semiconductor chip into a molded body to form a composite body. In this case, the top side of the optoelectronic semiconductor chip is at least partly not covered by the molded body. The method comprises further steps of establishing an electrically conductive through contact extending from a top side of the composite body to an underside of the composite body through the molded body, establishing a first top side metallization on the top side of the composite body, the first top side metallization electrically conductively connecting the first electrical contact to the through contact, and establishing a second top side metallization on the top side of the composite body, the second top side metallization being electrically insulated with respect to the first top side metallization.

Advantageously, an optoelectronic component comprising extremely compact external dimensions is obtainable by this method. In this case, the second top side metallization formed on the top side of the composite body of the optoelectronic component may reflectively coat the top side of the composite body, as a result of which the optoelectronic component obtainable by the method may comprise low absorption losses and thus a high efficiency.

The second top side metallization established on the top side of the composite body may additionally prevent an excessive aging of the material of the molded body of the optoelectronic component obtainable by the method, as a result of which the lifetime of the optoelectronic component may increase.

The method comprises a further step of arranging a wavelength-converting material in a region completely delimited by the second top side metallization on the top side of the composite body. The wavelength-converting material may, in the optoelectronic component obtainable by the method, convert electromagnetic radiation emitted by the optoelectronic semiconductor chip at least partly into electromagnetic radiation of a different wavelength.

Before establishing the first top side metallization, a further step may be carried out to arrange an electrically insulating material above the edge region of the top side of the optoelectronic semiconductor chip. This advantageously prevents formation of an electrically conductive connection between the first top side metallization and a second electrical contact of the optoelectronic semiconductor chip, for example, as a result of a slag burr arranged in the edge region of the top side of the optoelectronic semiconductor chip and which electrically conductively connects to the second electrical contact of the optoelectronic semiconductor chip.

The first top side metallization and/or the second top side metallization may be established by an electrolytic method. Advantageously, this method makes it possible to form the first top side metallization and/or the second top side metallization with a large thickness. As a result, the second top side metallization may delimit, for example, a cavity that may receive a potting material, for example, receive a wavelength-converting potting material. The cavity formed by the second top side metallization may be filled with potting material such that the potting material extends as far as the second top side metallization.

The method may comprise a further step of arranging an encapsulation layer on the first top side metallization and the second top side metallization. The encapsulation layer may increase reflectivity of the first top side metallization and the second top side metallization.

Arranging the encapsulation layer may be carried out by electroless deposition. Advantageously, this enables a simple arrangement (protecting the optoelectronic component obtainable by the method) of the encapsulation layer on the first top side metallization and on the second top side metallization.

The through contact may be embedded jointly with the optoelectronic semiconductor chip into the molded body. Advantageously, as a result, the method is implementable particularly simply, rapidly and cost-effectively. The through contact may be formed, for example, in a pin-shaped fashion and comprise an electrically conductive material, for example, a metal or a doped semiconductor material.

The first top side metallization and the second top side metallization may be established in common work steps. Advantageously, as a result, the method is implementable particularly simply, rapidly and cost-effectively.

The above-described properties, features and advantages and the way in which they are achieved will become clearer and more clearly understandable in association with the following description of examples explained in greater detail in association with the drawings.

FIG. 1 shows a schematic plan view of a first optoelectronic component 10 in an unfinished processing state. The first optoelectronic component 10 emits electromagnetic radiation, for example, visible light. The first optoelectronic component 10 may be, for example, a light emitting diode component (LED component).

The first optoelectronic component 10 comprises a composite body 100 formed by a molded body 200 and by a optoelectronic semiconductor chip 300 embedded into the molded body 200, a through contact 400 embedded into the molded body 200, and a protective diode 500 embedded into the molded body 200.

The molded body 200 may also be referred to as a mold body and may be formed, for example, by a molding method (mold method) from a molding material (mold material). The molding material is electrically insulating and may comprise, for example, an epoxy resin and/or a silicone. The molding method used to produce the molded body 200 may be, for example, compression molding or transfer molding, in particular, for example, a foil-assisted transfer molding.

The optoelectronic semiconductor chip 300, the through contact 400 and the protective diode 500 are preferably embedded into the molded body 200 already during the production of the molded body 200 to form the composite body 100. In this case, the molding material of the molded body 200 is molded around the optoelectronic semiconductor chip 300, the through contact 400 and the protective diode 500.

A top side 301 of the optoelectronic semiconductor chip 300, a top side 401 of the through contact 400 and a top side 501 of the protective diode 500 are each at least partly not covered by the material of the molded body 200 and, as a result, are at least partly exposed on a top side 201 of the molded body 200. Preferably, the top side 301 of the optoelectronic semiconductor chip 300, the top side 401 of the through contact 400 and the top side 501 of the protective diode 500 terminate flush with the top side 201 of the molded body 200. The top side 201 of the molded body 200, the top side 301 of the optoelectronic semiconductor chip 300, the top side 401 of the through contact 400 and the top side 501 of the protective diode 500 jointly form a top side 101 of the composite body 100.

Figure 3:
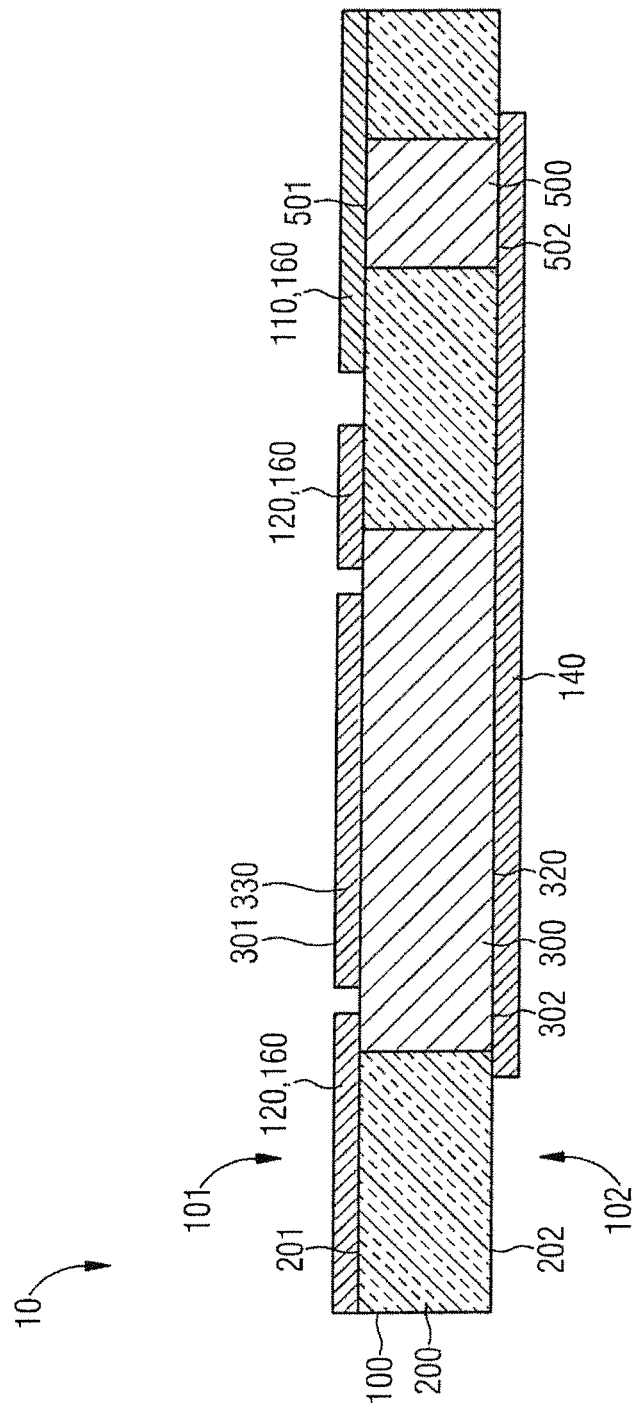
FIG. 3 schematically shows a first sectional side view of the first optoelectronic component.
Figure 4:
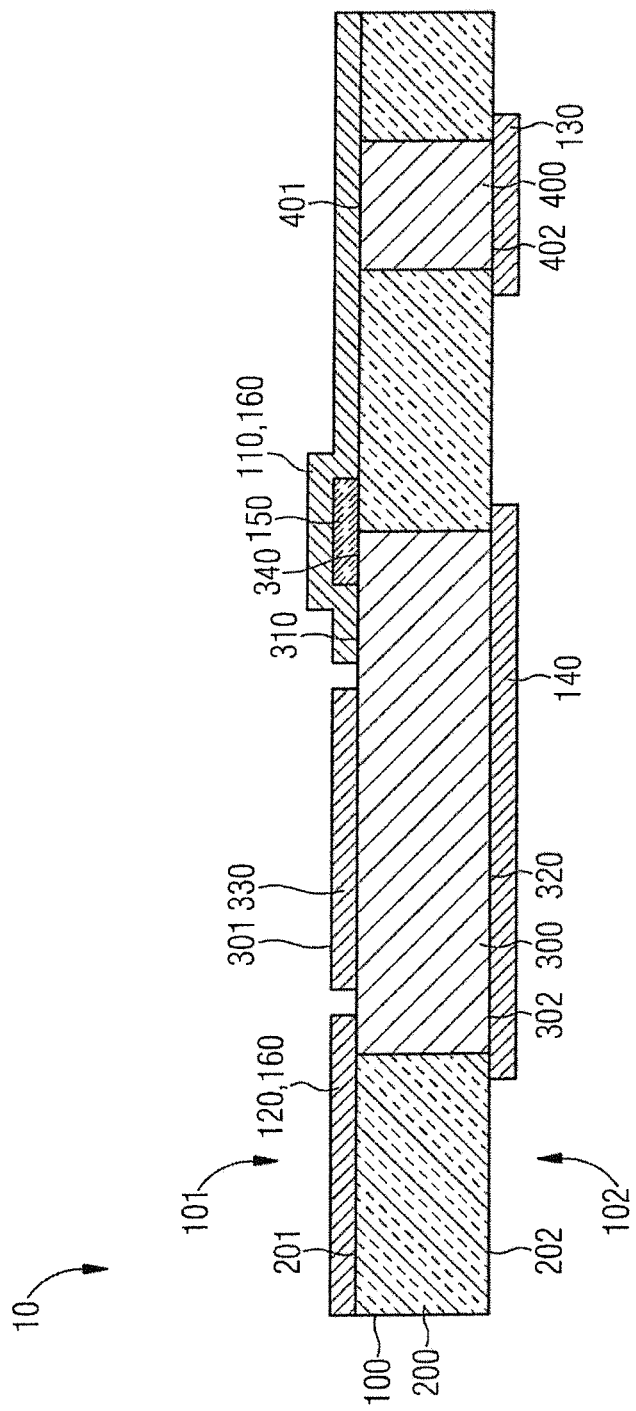
FIG. 4 schematically shows a second sectional side view of the first optoelectronic component.

It is not discernible in the plan view in FIG. 1, but it is illustrated in FIGS. 3 and 4, explained further below, that an underside 302 of the optoelectronic semiconductor chip 300 located opposite the top side 301 of the optoelectronic semiconductor chip 300, an underside 402 of the through contact 400 located opposite the top side 401 of the through contact 400, and an underside 502 of the protective diode 500 located opposite the top side 501 of the protective diode 500 are also at least partly not covered by the material of the molded body 200 and, as a result, are also at least partly exposed on an underside 202 of the molded body 200 located opposite the top side 201 of the molded body 200. Preferably, the underside 302 of the optoelectronic semiconductor chip 300, the underside 402 of the through contact 400 and the underside 502 of the protective diode 500 terminate flush with the underside 202 of the molded body 200. The underside 202 of the molded body 200, the underside 302 of the optoelectronic semiconductor chip 300, the underside 402 of the through contact 400 and the underside 502 of the protective diode 500 jointly form an underside 102 of the composite body 100.

The optoelectronic semiconductor chip 300 may be, for example, a light emitting diode chip (LED chip). The optoelectronic semiconductor chip 300 comprises a mesa 330 on its top side 301, the mesa forming a radiation emission face of the optoelectronic semiconductor chip 300. The optoelectronic semiconductor chip 300 is configured to emit electromagnetic radiation, for example, visible light in the region of the mesa 330 on its top side 301.

On its top side 301, the optoelectronic semiconductor chip 300 comprises a first electrical contact 310. It is discernible in FIG. 3 that the optoelectronic semiconductor chip 300 additionally comprises a second electrical contact 320 on its underside 302. Electrical voltage and electrical current may be applied to the optoelectronic semiconductor chip 300 via the electrical contacts 310, 320 thereof to cause the optoelectronic semiconductor chip 300 to emit electromagnetic radiation.

The through contact 400 comprises an electrically conductive material. As a result, the through contact 400 forms an electrically conductive connection extending from the top side 101 of the composite body 100 to the underside 102 of the composite body 100 through the molded body 200. The through contact 400 may comprise, for example, a metal or a doped semiconductor material. Instead of the through contact 400 already being embedded into the molded body 200 jointly with the optoelectronic semiconductor chip 300 and the protective diode 500 during formation of the molded body 200, it is also possible, only after formation of the molded body 200, to establish an opening extending from the top side 201 to the underside 202 through the molded body 200 and fill the opening with an electrically conductive material to form the through contact 400.

The protective diode 500 protects the optoelectronic semiconductor chip 300 against damage as a result of electrostatic discharges. For this purpose, the protective diode 500 electrically connects in antiparallel with the optoelectronic semiconductor chip 300 in the first optoelectronic component 10 in the manner explained below with reference to FIGS. 2 to 4. It is possible to dispense with the protective diode 500.

In a manner governed by production, the optoelectronic semiconductor chip 300 may comprise slag burrs 350 in an edge region 340 between its top side 301 and sidewalls extending between the top side 301 and the underside 302, which slag burrs may rise above the top side 301 of the optoelectronic semiconductor chip 300, for example, by up to 20 µm in a direction perpendicular to the top side 301. The slag burrs 350 may electrically conductively connect to the second electrical contact 320 on the underside 302 of the optoelectronic semiconductor chip 300 via a substrate of the optoelectronic semiconductor chip 300.

Figure 2:
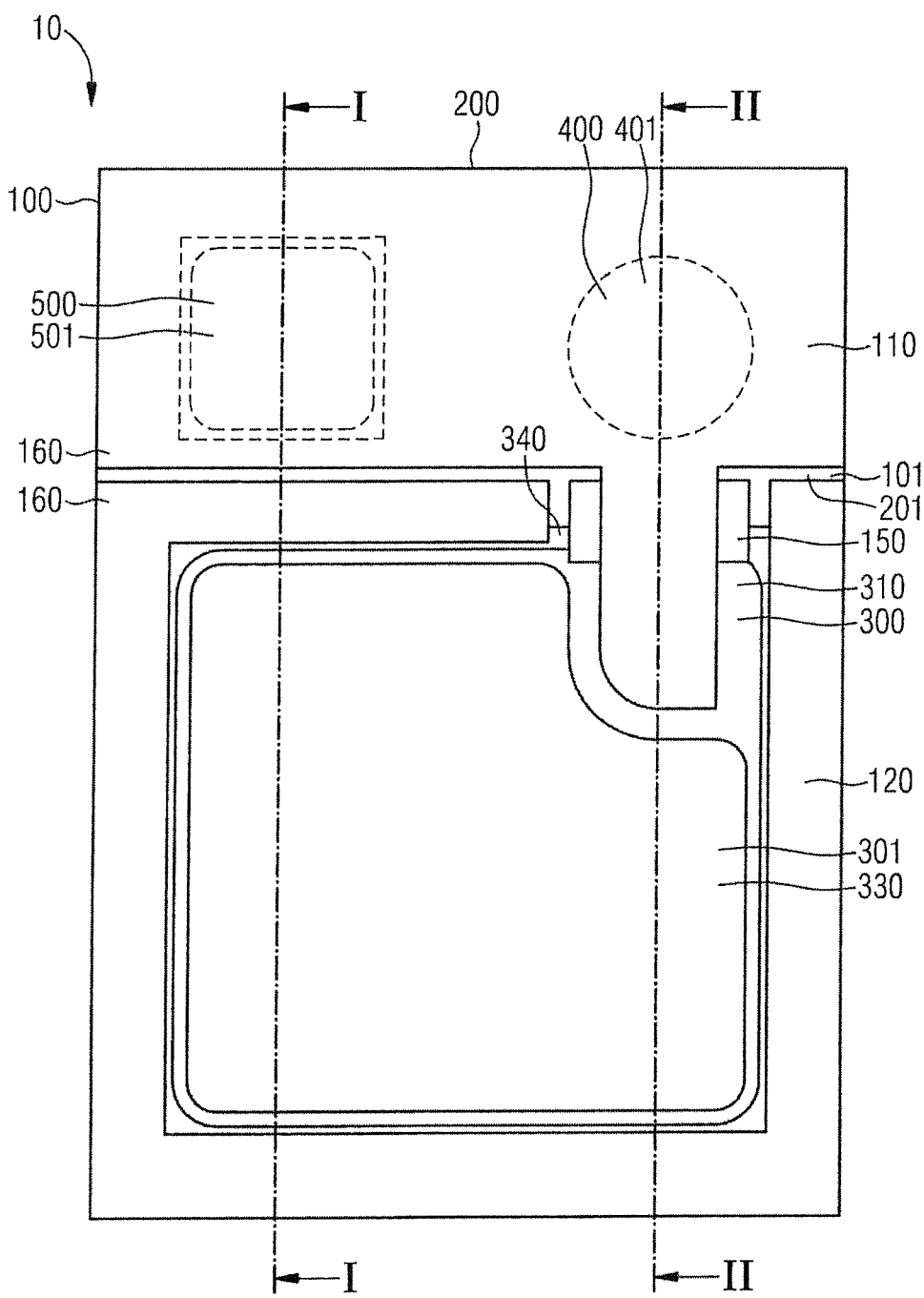
FIG. 2 schematically shows a plan view of the first optoelectronic component in the completed state.

FIG. 2 shows a schematic plan view of the first optoelectronic component 10 in a processing state that temporally succeeds the illustration in FIG. 1. The first optoelectronic component 10 is completed in the processing state shown in FIG. 2.

FIG. 3 shows a schematic sectional side view of the first optoelectronic component 10 in which the first optoelectronic component 10 is cut on a sectional plane I-I depicted in FIG. 2. The sectional plane I-I extends through the optoelectronic semiconductor chip 300 and the protective diode 500.

FIG. 4 shows a schematic sectional side view of the first optoelectronic component 10 in which the first optoelectronic component 10 is cut on a sectional plane II-II depicted in FIG. 2. The sectional plane II-II extends through the optoelectronic semiconductor chip 300 and the through contact 400 of the first optoelectronic component 10. In this case, the sectional plane II-II runs through the first electrical contact 310 of the optoelectronic semiconductor chip 300.

Proceeding from the processing state shown in FIG. 1, first, an electrically insulating material 150 was arranged on a portion of the top side 101 of the composite body 100. Arranging the electrically insulating material 150 may have been carried out, for example, by mask lithography or, for example, by a lithographic method in which a photoactive material is directly exposed by a laser. Alternatively, arranging the electrically insulating material 150 may also be carried out by some other application method that manages without lithographic patterning, for example, by a printing method, for instance by screen printing, stencil printing or pad printing, or by a serial method such as jetting, for instance inkjet or aerosol jetting, or dispensing. The electrically insulating material 150 extends over a portion of the top side 301 of the optoelectronic semiconductor chip 300 in the edge region 340 of the top side 301 of the optoelectronic semiconductor chip 300 and over a portion of the top side 201 of the molded body 200 that adjoins the portion of the top side 301 of the optoelectronic semiconductor chip 300. Slag burrs 350 possibly arranged in this portion of the edge region 340 of the top side 301 of the optoelectronic semiconductor chip 300 are completely covered by the electrically insulating material 150. In this case, the electrically insulating material 150 is arranged between the first electrical contact 310 on the top side 301 of the optoelectronic semiconductor chip 300 and the top side 401 of the through contact 400.

In a subsequent processing step, a first top side metallization 110 and a second top side metallization 120 were established on the top side 101 of the composite body 100. The first top side metallization 110 and the second top side metallization 120 may have been established simultaneously in common work steps or successively in an arbitrary order.

The first top side metallization 110 extends from the first electrical contact 310 on the top side 301 of the optoelectronic semiconductor chip 300 over the electrically insulating material 150 to the top side 401 of the through contact 400. In this case, the first top side metallization 110 produces an electrically conductive connection between the first electrical contact 310 of the optoelectronic semiconductor chip 300 and the through contact 400. The electrically insulating material 150 electrically insulates the first top side metallization 110 with respect to slag burrs 350 possibly arranged in the edge region 340 of the top side 301 of the optoelectronic semiconductor chip 300, thereby ensuring that there is no electrically conductive connection between the first top side metallization 110 and the second electrical contact 320 of the optoelectronic semiconductor chip 300. The first top side metallization 110 additionally extends to the top side 501 of the protective diode 500, as a result of which an electrically conductive connection is also formed between the first electrical contact 310 of the optoelectronic semiconductor chip 300 and the top side 501 of the protective diode 500.

The second top side metallization 120 is spaced apart from the first top side metallization 110 and is thereby electrically insulated with respect to the first top side metallization 110. The second top side metallization 120 preferably extends over a large part of that part of the top side 101 of the composite body 100 which is not covered by the first top side metallization 110. In this case, the second top side metallization 120 may also extend over a part of the top side 301 of the optoelectronic semiconductor chip 300 and electrically conductively connect to the second electrical contact 320 of the optoelectronic semiconductor chip 300 by slag burrs 350 arranged in the edge region 340 of the top side 301 of the optoelectronic semiconductor chip 300.

The radiation emission face formed by the mesa 330 on the top side 301 of the optoelectronic semiconductor chip 300 is covered neither by the first top side metallization 110 nor by the second top side metallization 120.

The parts of the top side 101 of the composite body 100 covered by the first top side metallization 110 and the second top side metallization 120 comprise a higher reflectivity than uncovered parts of the top side 101 of the composite body 100. As a result, electromagnetic radiation emitted by the optoelectronic semiconductor chip of the first optoelectronic component 10 and which is backscattered to the top side 101 of the composite body 100 of the first optoelectronic component 10 may be reflected at the top side metallizations 110, 120 on the top side 101 of the composite body 100 instead of being absorbed on the top side 101 of the composite body 100. As a result, the first optoelectronic component 10 may comprise a high efficiency.

The first top side metallization 110 and the second top side metallization 120 may be established by a mask-lithographic method, for example. Alternatively, the first top side metallization 110 and the second top side metallization 120 may be established by a lithographic method in which a photoresist is directly exposed by a laser. The first top side metallization 110 and the second top side metallization 120 may also be established or reinforced by an electrolytic method.

The first top side metallization 110 and the second top side metallization 120 may be encapsulated by a metallic encapsulation layer 160 on their surfaces. This is expedient particularly if the first top side metallization 110 and the second top side metallization 120 are established by a copper-electrolytic method. In this case, the encapsulation layer 160 may comprise a highly reflective metal. The encapsulation layer 160 is preferably deposited by an electroless method.

It is discernible in FIGS. 3 and 4 that a first underside metallization 130 and a second underside metallization 140 are arranged on the underside 102 of the composite body 100 of the first optoelectronic component 10. The first underside metallization 130 and the second underside metallization 140 may have been established on the underside 102 of the composite body 100 in common or successive processing steps. In this case, the underside metallizations 130, 140 may have been established before or after the electrically insulating material 150 and the top side metallizations 110, 120. Establishing the underside metallizations 130, 140 may be carried out, for example, by a lithographic method, for example, by a mask-lithographic method.

The first underside metallization 130 extends over the underside 402 of the through contact 400 and electrically conductively connects to the through contact 400. As a result, via the through contact 400 and the first top side metallization 110 there is an electrically conductive connection between the first underside metallization 130 and the first electrical contact 310 of the optoelectronic semiconductor chip 300 of the first optoelectronic component 10. The second underside metallization 140 is spaced apart from the first underside metallization 130 and thereby electrically insulated with respect to the first underside metallization 130. The second underside metallization 140 extends over the underside 302 of the optoelectronic semiconductor chip 300 and electrically conductively connects to the second electrical contact 320 of the optoelectronic semiconductor chip 300 on the underside 302 of the optoelectronic semiconductor chip 300.

In addition, the second underside metallization 140 extends over the underside 402 of the protective diode 500 and electrically conductively connects to the underside 502 of the protective diode 500. The underside 502 of the protective diode 500 thus also electrically conductively connects to the second electrical contact 320 of the optoelectronic semiconductor chip 300. Since the top side 501 of the protective diode 500 electrically conductively connects to the first electrical contact 310 of the optoelectronic semiconductor chip 300 via the first top side metallization 110, the protective diode 500 thus connects in antiparallel with the optoelectronic semiconductor chip 300.

The first underside metallization 130 and the second underside metallization 140 on the underside 102 of the composite body 100 of the first optoelectronic component 10 may form soldering contact pads of the first optoelectronic component 10 and serve for the electrical contacting of the first optoelectronic component 10. The first optoelectronic component 10 may be suitable, for example, as an SMT component for surface mounting, for example, for surface mounting by reflow soldering.

The first optoelectronic component 10 may be produced jointly with a plurality of first optoelectronic components 10 of identical type in a panel assemblage in common work processes. For this purpose, a plurality of optoelectronic semiconductor chips 300, through contacts 400 and protective diodes 500 are embedded into a common large molded body. Arranging the electrically insulating material 150 and the top side metallizations 110, 120 and underside metallizations 130, 140 for each set of an optoelectronic semiconductor chip 300, a through contact 400 and a protective diode 500 is carried out in parallel in common processing steps. It is only upon the conclusion of processing that the panel assemblage is divided to singulate the individual composite bodies 100 of the individual first optoelectronic components 10.

FIG. 5 shows a schematic plan view of a second optoelectronic component 20. The second optoelectronic component 20 corresponds in large part to the first optoelectronic component 10 in FIGS. 2 to 4. Component parts of the second optoelectronic component 20 corresponding to component parts present in the first optoelectronic component 10 are provided with the same reference signs in FIG. 5 as in FIGS. 2 to 4 and are not described in detail again below. The second optoelectronic component 20 may be produced by the method of producing the first optoelectronic component 10 as explained with reference to FIGS. 1 to 4.

The second optoelectronic component 20 differs from the first optoelectronic component 10 in that, in the second optoelectronic component 20, the proportion of the area of the top side 101 of the composite body 100 covered by the first top side metallization 110 is reduced in favor of the area of the top side 101 of the composite body 100 covered by the second top side metallization 120. In the second optoelectronic component 20, the second top side metallization 120 thus covers a larger area than in the first optoelectronic component 10. This may be expedient, for example, if the second top side metallization 120 comprises a higher reflectivity than the first top side metallization 110. In this case, the second optoelectronic component 20 comprises a higher reflectivity than the first optoelectronic component 10.

In the second optoelectronic component 20, the reduction of that part of the top side 101 of the composite body 100 covered by the first top side metallization 110 may be achieved or supported, for example, by the protective diode 500 and the through contact 400 being arranged closer to one another than in the first optoelectronic component 10. As a result, the top side 401 of the through contact 400 and the top side 501 of the protective diode 500 are also arranged closer to one another, which makes it possible to form the first top side metallization 110 with a smaller area.

FIG. 6 shows a schematic plan view of a third optoelectronic component 30. The third optoelectronic component 30 corresponds in large part to the first optoelectronic component 10 in FIGS. 2 to 4. Component parts of the third optoelectronic component 30 corresponding to component parts present in the first optoelectronic component 10 are provided with the same reference signs in FIG. 6 as in FIGS. 2 to 4 and are not described in detail again below. The third optoelectronic component 30 in FIG. 6 may be produced using the method explained with reference to FIGS. 1 to 4, provided that the deviations and special features described below are taken into consideration.

The third optoelectronic component 30 differs from the first optoelectronic component 10 in that, in the third optoelectronic component 30, the size of the first top side metallization 110 is reduced in favor of the size of the second top side metallization 120. This may be made possible or supported, for example, by the measures explained with reference to the second optoelectronic component 20 in FIG. 5.

The second top side metallization 120 on the top side 101 of the composite body 100 of the third optoelectronic component 30 completely delimits the first top side metallization 110 on the top side 101 of the composite body 100 of the third optoelectronic component 30. As a result, the second top side metallization 120 of the third optoelectronic component 30 also completely delimits the top side 301 of the optoelectronic semiconductor chip 300, in particular the radiation emission face in the region of the mesa 330 on the top side 301 of the optoelectronic semiconductor chip 300. The second top side metallization 120 of the third optoelectronic component 30 on the top side 101 of the composite body 100 of the third optoelectronic component 30 thus forms a closed boundary around a delimited region 170 on the top side 101 of the composite body 100. The region 170 delimited by the closed boundary may also be referred to as a cavity formed by the second top side metallization 120.

FIG. 7 shows a schematic sectional side view of the third optoelectronic component 30. In this case, the third optoelectronic component 30 is cut on a sectional plane which is depicted in FIG. 6 and which extends through the optoelectronic semiconductor chip 300 and through the protective diode 500 of the third optoelectronic component 30.

It is discernible in FIG. 7 that the second top side metallization 120 on the top side 101 of the composite body 100 of the third optoelectronic component 30 comprises a larger thickness than the second top side metallization 120 of the first optoelectronic component 10 in a direction perpendicular to the top side 101 of the composite body 100. The increased thickness of the second top side metallization 120 of the third optoelectronic component 30 may have been produced by an electrolytic method, for example.

In the example illustrated schematically in FIGS. 6 and 7, the second top side metallization 120 comprises a higher thickness than the first top side metallization 110 in a direction perpendicular to the top side 101 of the composite body 100. However, this is not absolutely necessary. It is likewise possible to form the first top side metallization 110 with the same thickness as the second top side metallization 120.

A wavelength-converting material 600 is arranged in the region 170 on the top side 101 of the composite body 100, the region being delimited by the second top side metallization 120 on the top side 101 of the composite body 100 of the third optoelectronic component 30, that is to say in the cavity formed by the second top side metallization 120. As a result, the wavelength-converting material 600 is arranged above the emission face in the region of the mesa 330 on the top side 301 of the optoelectronic semiconductor chip 300. The wavelength-converting material 600 extends as far as the second top side metallization 120.

The wavelength-converting material 600 may comprise, for example, a matrix material and wavelength-converting particles embedded into the matrix material. The matrix material may comprise silicone, for example. The wavelength-converting material 600 may have been filled by a dosing method, for example, into the region 170 delimited by the second top side metallization 120 on the top side 101 of the composite body 100 of the third optoelectronic component 30, that is to say into the cavity formed by the second top side metallization 120.

The wavelength-converting material 600 converts electromagnetic radiation emitted by the optoelectronic semiconductor chip 300 of the third optoelectronic component 30 at least partly into electromagnetic radiation of a different wavelength. By way of example, the wavelength-converting material 600 may convert electromagnetic radiation comprising a wavelength from the blue or ultraviolet spectral range into electromagnetic radiation comprising a wavelength from the yellow spectral range. A mixture of unconverted electromagnetic radiation and converted electromagnetic radiation may comprise a white color impression, for example.

Our components and methods have been illustrated and described in greater detail on the basis of the preferred examples. Nevertheless, this disclosure is not restricted to the examples disclosed. Rather, other variations may be derived therefrom by those skilled in the art without departing from the scope of protection of the appended claims.

This application claims priority of DE 10 2014 116 080.0, the subject matter of which is incorporated herein by reference.

The invention claimed is:

1. An optoelectronic component comprising:
    a composite body comprising a molded body; and
    an optoelectronic semiconductor chip embedded into the molded body,
        wherein an electrically conductive through contact extends from a top side of the composite body to an underside of the composite body through the molded body,
        a top side of the optoelectronic semiconductor chip is at least partly not covered by the molded body, the optoelectronic semiconductor chip comprises a first electrical contact on its top side,
a first top side metallization is arranged on the top side of the composite body and electrically conductively connects the first electrical contact to the through contact,
a second top side metallization is arranged on the top side of the composite body and electrically insulated with respect to the first top side metallization,
the second top side metallization completely delimits a part of the top side of the optoelectronic semiconductor chip, and
a wavelength-converting material is arranged in a region completely delimited by the second top side metallization on the top side of the composite body, said wavelength-converting material extending as far as the second top side metallization.

2. The optoelectronic component according to claim 1, wherein the second top side metallization extends over a part of the top side of the optoelectronic semiconductor chip.

3. The optoelectronic component according to claim 1, wherein the second top side metallization completely delimits the first top side metallization.

4. The optoelectronic component according to claim 1, wherein the second top side metallization comprises a higher thickness than the first top side metallization in a direction perpendicular to the top side of the composite body.

5. The optoelectronic component according to claim 1, wherein above an edge region of the top side of the optoelectronic semiconductor chip an electrically insulating material is arranged between the top side of the optoelectronic semiconductor chip and the first top side metallization.

6. The optoelectronic component according to claim 1, wherein a first underside metallization is arranged on the underside of the composite body and electrically conductively connects to the through contact.

7. The optoelectronic component according to claim 1,
wherein an underside of the optoelectronic semiconductor chip is at least partly exposed on the underside of the composite body, and
the optoelectronic semiconductor chip comprises a second electrical contact on its underside.

8. The optoelectronic component according to claim 7, wherein the second top side metallization electrically conductively connects to the second electrical contact.

9. The optoelectronic component according to claim 7, wherein a second underside metallization is arranged on the underside of the composite body and electrically conductively connects to the second electrical contact.

10. The optoelectronic component according to claim 1,
wherein a protective diode is embedded into the molded body, and
the first top side metallization electrically conductively connects to the protective diode.

11. The optoelectronic component according to claim 9, wherein the second underside metallization electrically conductively connects to the protective diode.

12. A method of producing an optoelectronic component comprising:
providing an optoelectronic semiconductor chip comprising a first electrical contact on a top side;
embedding the optoelectronic semiconductor chip into a molded body to form a composite body, the top side of the optoelectronic semiconductor chip is at least partly not covered by the molded body;
establishing an electrically conductive through contact extending from a top side of the composite body to an underside of the composite body through the molded body;
establishing a first top side metallization on the top side of the composite body, said first top side metallization electrically conductively connecting the first electrical contact to the through contact;
establishing a second top side metallization on the top side of the composite body, said second top side metallization being electrically insulated with respect to the first top side metallization, wherein the second top side metallization completely delimits a part of the top side of the optoelectronic semiconductor chip; and
arranging a wavelength-converting material in a region completely delimited by the second top side metallization on the top side of the composite body, wherein the wavelength-converting material extends as far as the second top side metallization.

13. The method according to claim 12, wherein the wavelength-converting material is arranged in the region delimited by the second top side metallization by a dosing method.

14. The method according to claim 12, further comprising, before establishing the first top side metallization, arranging an electrically insulating material above an edge region of the top side of the optoelectronic semiconductor chip.

15. The method according to claim 12, wherein the first top side metallization is established by an electrolytic method or the second top side metallization is established by an electrolytic method or the first top side metallization and the second top side metallization are established by an electrolytic method.

16. The method according to claim 12, further comprising arranging an encapsulation layer on the first top side metallization and on the second top side metallization.

17. The method according to claim 16, wherein arranging the encapsulation layer is carried out by electroless deposition.

18. The method according to claim 12, wherein the through contact is embedded jointly with the optoelectronic semiconductor chip into the molded body.

19. The method according to claim 12, wherein the first top side metallization and the second top side metallization are established in common work steps.

* * * * *